United States Patent
Suzuki et al.

(10) Patent No.: US 12,194,459 B2
(45) Date of Patent: *Jan. 14, 2025

(54) MASTER FOR MICRO FLOW PATH CREATION, TRANSFER COPY, AND METHOD FOR PRODUCING MASTER FOR MICRO FLOW PATH CREATION

(71) Applicant: DEXERIALS CORPORATION, Tokyo (JP)

(72) Inventors: Shinya Suzuki, Tokyo (JP); Kazuya Hayashibe, Tokyo (JP); Akihiro Shibata, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 1129 days.

This patent is subject to a terminal disclaimer.

(21) Appl. No.: 16/927,425

(22) Filed: Jul. 13, 2020

(65) Prior Publication Data

US 2020/0338551 A1    Oct. 29, 2020

Related U.S. Application Data

(63) Continuation of application No. 15/531,267, filed as application No. PCT/JP2015/080104 on Oct. 26, 2015, now Pat. No. 10,850,273.

(30) Foreign Application Priority Data

Nov. 28, 2014 (JP) .................. 2014-241728

(51) Int. Cl.
*B01L 3/00* (2006.01)
*B01J 19/00* (2006.01)
(Continued)

(52) U.S. Cl.
CPC ..... *B01L 3/502707* (2013.01); *B01J 19/0093* (2013.01); *B01L 3/50273* (2013.01);
(Continued)

(58) Field of Classification Search
None
See application file for complete search history.

(56) References Cited

U.S. PATENT DOCUMENTS 6,451,264 B1     9/2002   Bhullar et al.
10,850,273 B2 *  12/2020  Suzuki ............... B29C 35/0805
(Continued)

FOREIGN PATENT DOCUMENTS

CN    102247786 A    11/2011
JP    2003-001830 A   1/2003
(Continued)

OTHER PUBLICATIONS

Sep. 25, 2018, Japanese Office Action issued for related JP Application No. 2014-241728.
(Continued)

*Primary Examiner* — Jennifer Wecker
*Assistant Examiner* — Bryan Kilpatrick
(74) *Attorney, Agent, or Firm* — Paratus Law Group, PLLC

(57) ABSTRACT

There is provided a master for micro flow path creation, a transfer copy, and a method for producing a master for micro flow path creation by which transfer copies having an area with high hydrophilicity can be easily mass-produced, the master for micro flow path creation including: a base material; a main concave-convex portion provided on a surface of the base material and extending in a planar direction of the base material; and a fine concave-convex portion provided on a surface of the main concave-convex portion and having a narrower pitch than the main concave-convex portion. The (Continued)

fine concave-convex portion has an arithmetic average roughness of 10 nm to 150 nm and has a specific surface area ratio of 1.1 to 3.0.

18 Claims, 13 Drawing Sheets

(51) Int. Cl.
    *B29C 33/38*     (2006.01)
    *B29C 33/42*     (2006.01)
    *B29C 35/08*     (2006.01)
    *B29C 59/02*     (2006.01)
    *B81C 99/00*     (2010.01)
    *G03F 7/00*     (2006.01)

(52) U.S. Cl.
    CPC ........ *B01L 3/502746* (2013.01); *B29C 33/38* (2013.01); *B29C 33/3842* (2013.01); *B29C 33/42* (2013.01); *B29C 35/0805* (2013.01); *B29C 59/022* (2013.01); *B81C 99/0085* (2013.01); *B81C 99/009* (2013.01); *G03F 7/0002* (2013.01); *B01J 2219/00786* (2013.01); *B01J 2219/00833* (2013.01); *B01J 2219/00855* (2013.01); *B01L 2200/12* (2013.01); *B01L 2300/0851* (2013.01); *B01L 2300/161* (2013.01); *B01L 2400/088* (2013.01); *B29C 2035/0827* (2013.01); *B29C 2059/023* (2013.01)

(56) References Cited

U.S. PATENT DOCUMENTS

| | | |
|---|---|---|
| 2004/0094705 A1 | 5/2004 | Wood et al. |
| 2005/0026346 A1 | 2/2005 | Blankenstein et al. |
| 2008/0056945 A1 | 3/2008 | Hattori |
| 2011/0172109 A1 | 7/2011 | Blankenstein et al. |
| 2012/0097434 A1* | 4/2012 | Kajiya ............ G06K 19/07749 977/932 |
| 2013/0237034 A1 | 9/2013 | Breymesser et al. |
| 2017/0341074 A1* | 11/2017 | Suzuki ................... B29C 33/38 |

FOREIGN PATENT DOCUMENTS

| | | |
|---|---|---|
| JP | 2003-211400 A | 7/2003 |
| JP | 2005-003688 A | 1/2005 |
| JP | 2005-227223 A | 8/2005 |
| JP | 2006-103107 | 4/2006 |
| JP | 2006-272563 | 10/2006 |
| JP | WO 2007/055293 A1 | 5/2007 |
| JP | 2008-062561 | 3/2008 |
| JP | 2008-126283 A | 6/2008 |
| JP | 2008-194573 A | 8/2008 |
| JP | 2009-295797 A | 12/2009 |
| JP | WO 2009/145022 A1 | 12/2009 |
| JP | 2010-236955 A | 10/2010 |
| JP | 2011-102909 A | 5/2011 |
| JP | 2011-169695 A | 9/2011 |
| JP | 2012-037389 | 2/2012 |
| JP | 2014-109564 | 6/2014 |
| JP | 2014-136304 | 7/2014 |
| JP | 2014-196386 | 10/2014 |
| WO | WO2005/123242 A1 | 12/2005 |
| WO | WO 2009/145022 A1 | 12/2009 |
| WO | WO 2010/113545 A1 | 10/2010 |

OTHER PUBLICATIONS

Feb. 12, 2019, Japanese Office Action issued for related JP Application No. 2014-241728.
Jan. 7, 2020, Japanese Office Action issued for related JP Application No. 2014-241728.
Jan. 24, 2020, British Examination Report issued for related GB Application No. GB1708703.2.
Mar. 31, 2020, Japanese Office Action issued for related JP Application No. 2014-241728.
Apr. 6, 2021, Japanese Office Action issued for related JP Application No. 2020-038426.

* cited by examiner

FIG. 3
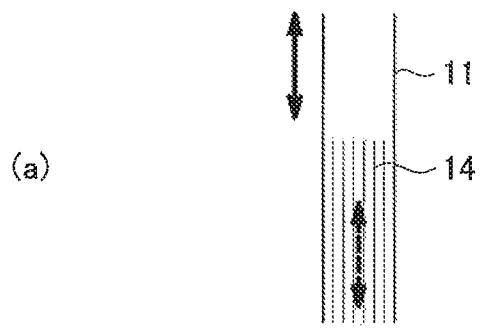
(a)
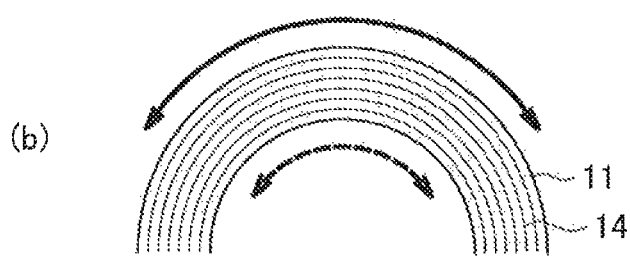
(b)
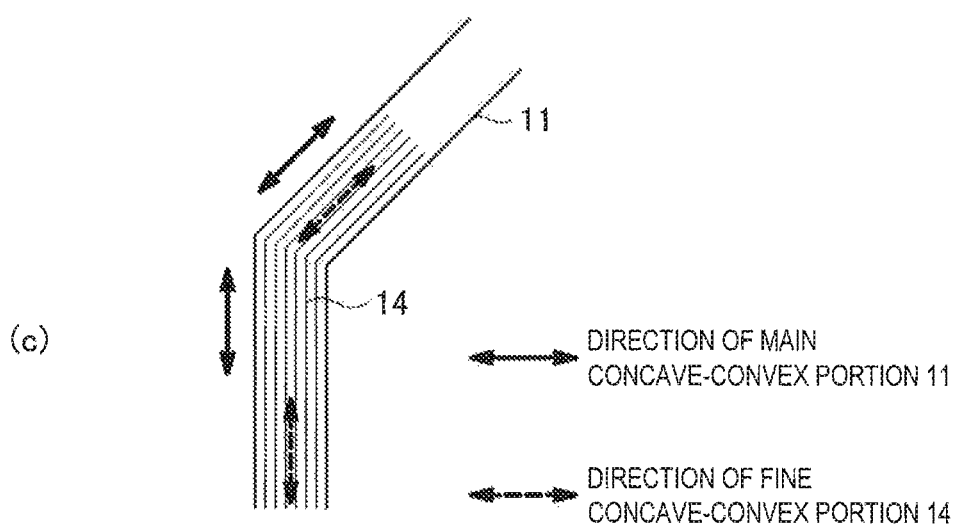
(c)
⟷ DIRECTION OF MAIN CONCAVE-CONVEX PORTION 11
⟷ DIRECTION OF FINE CONCAVE-CONVEX PORTION 14

FIG. 6
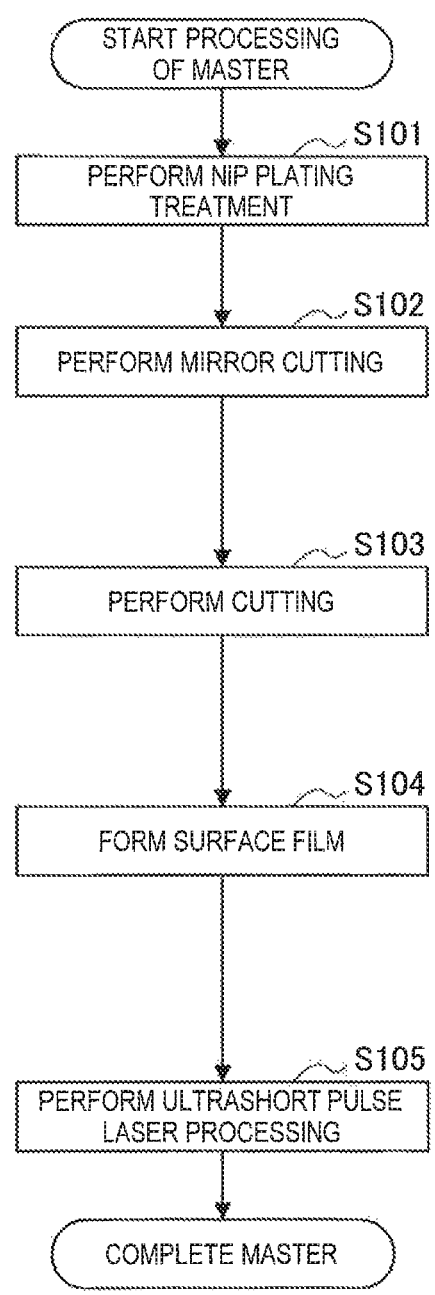
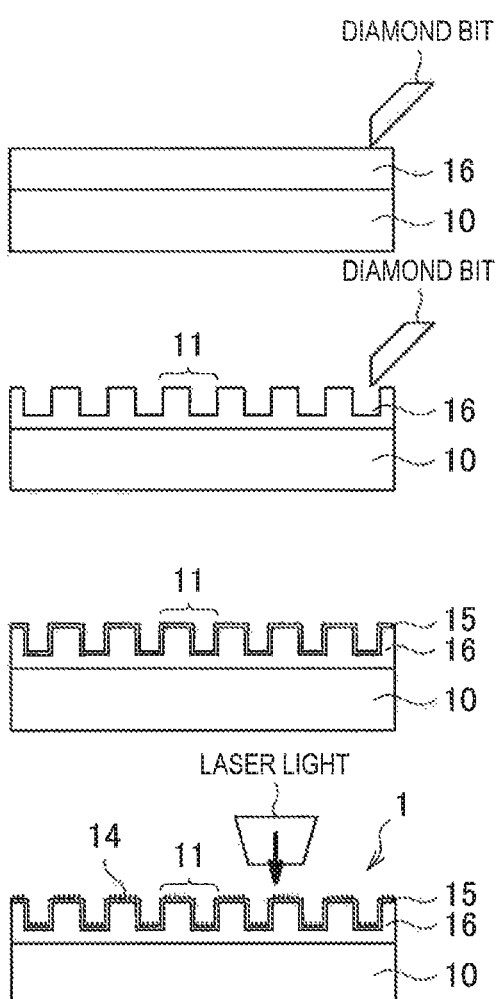

FIG. 8
(a) 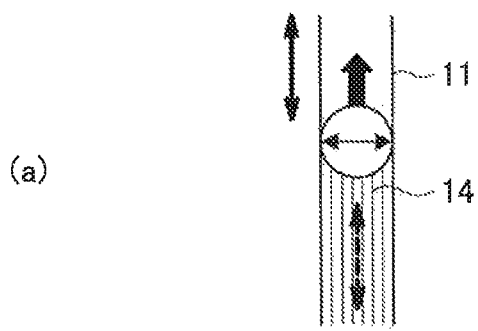
(b) 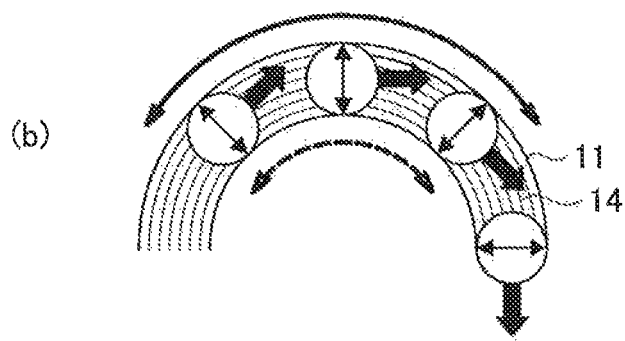
(c) 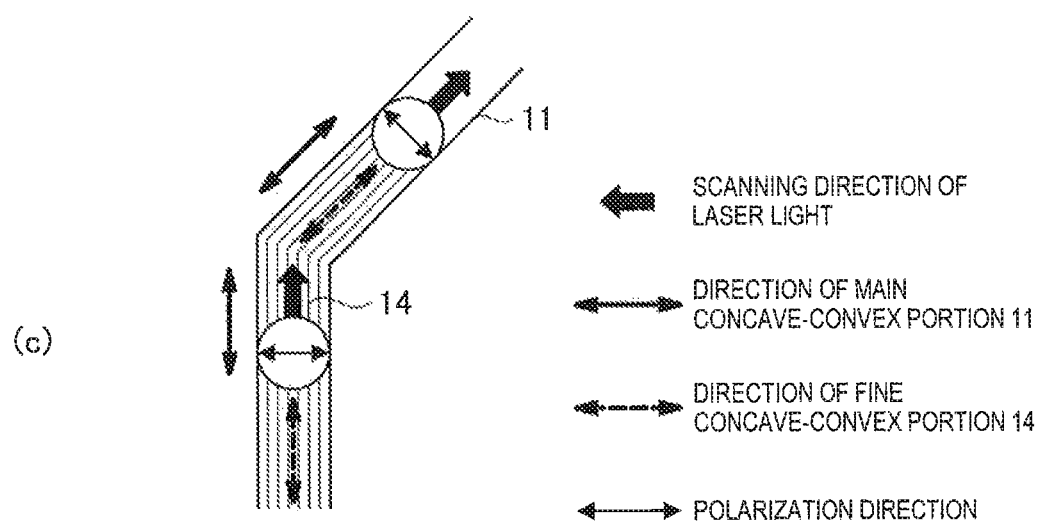

FIG. 11
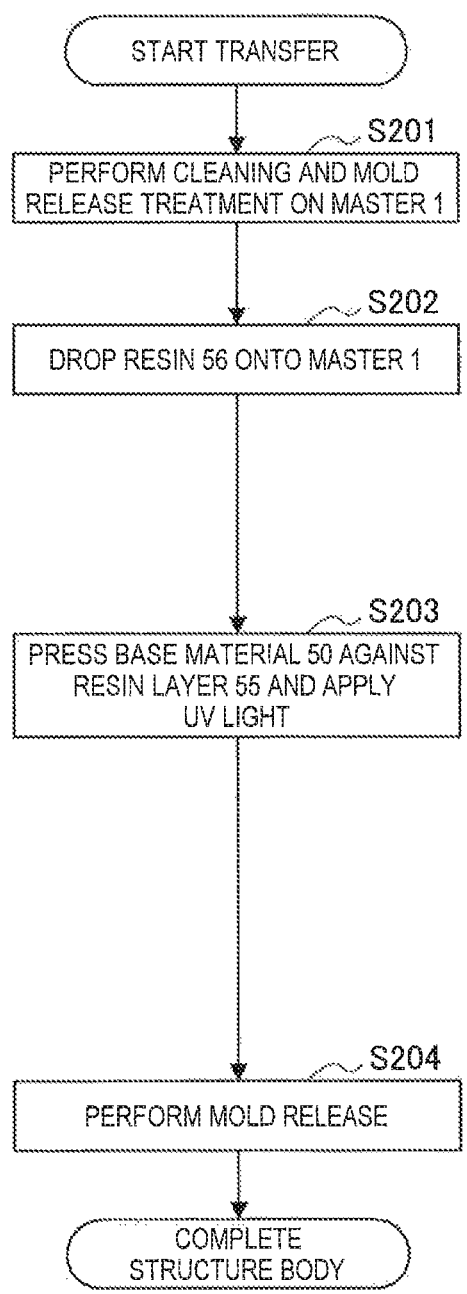
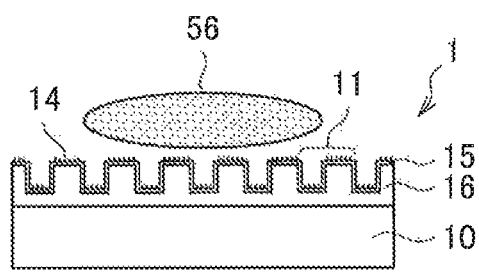
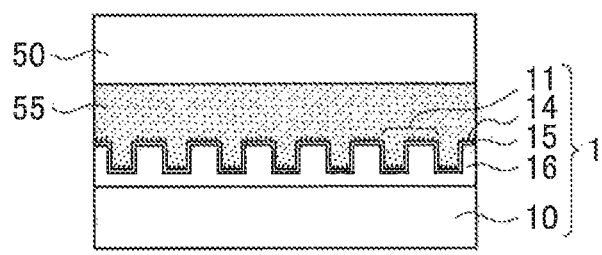
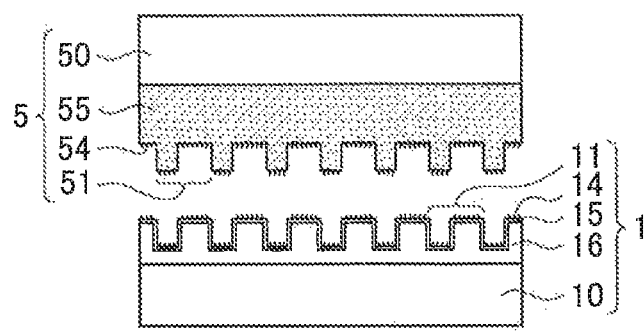

(a)　　　　　　　　　　　　(b)

⬌ DIRECTION OF MAIN CONCAVE-CONVEX PORTION 11

⬌ DIRECTION OF FINE CONCAVE-CONVEX PORTION 14

MASTER FOR MICRO FLOW PATH CREATION, TRANSFER COPY, AND METHOD FOR PRODUCING MASTER FOR MICRO FLOW PATH CREATION

CROSS REFERENCE TO PRIOR APPLICATION

This application is a continuation of U.S. patent application Ser. No. 15/531,267 (filed on May 26, 2017) which is a National Stage Patent Application of PCT International Patent Application No. PCT/JP2015/080104 (filed on Oct. 26, 2015) under 35 U.S.C. § 371, which claims priority to Japanese Patent Application No. 2014-241728 (filed on Nov. 28, 2014), which are all hereby incorporated by reference in their entirety.

TECHNICAL FIELD

The present invention relates to a master for micro flow path creation, a transfer copy, and a method for producing a master for micro flow path creation.

BACKGROUND ART

These days, micro fluid chips in which wells, micro flow paths, etc. for performing chemical and biological analysis are provided on a substrate made of resin or glass are developed.

For example, Patent Literature 1 below discloses a micro fluid chip in which a micro flow path made of PMMA (polymethylmethacrylate) is irradiated with femtosecond laser light and thereby the hydrophilicity of the surface of the micro flow path is enhanced. Patent Literature 2 below discloses a micro fluid chip in which the surface of a micro flow path made of silicone rubber is subjected to plasma modification treatment in a gas atmosphere containing nitrogen and an amine and thereby the hydrophilicity of the surface of the micro flow path is enhanced.

Further, Patent Literature 3 below discloses a method for creating a mold for creating a micro fluid chip. A micro fluid chip is created by performing nanoimprint transfer using this mold.

CITATION LIST

Patent Literature

Patent Literature 1: JP 2014-109564A
Patent Literature 2: JP 2014-1%386A
Patent Literature 3: JP 2006-272563A

SUMMARY OF INVENTION

Technical Problem

In Patent Literatures 1 and 2 above, a micro fluid chip having a micro flow path with high hydrophilicity is obtained by performing the treatment mentioned above. However, in the case where such micro fluid chips having an area with high hydrophilicity are mass-produced, it is necessary to perform the treatment mentioned above on a prescribed area of the individual micro fluid chip, and consequently the creation time and the creation cost are increased. Hence, from the viewpoint of mass productivity, it cannot be said that the methods described in Patent Literatures 1 and 2 above are preferred methods. Furthermore, when it is attempted to enhance the hydrophilicity of the surface of the micro flow path using the methods described in Patent Literatures 1 and 2 above, the material of the micro flow path is limited to PMMA or silicone rubber.

On the other hand, in Patent Literature 3 above, since a micro fluid chip is created as a transfer copy by performing nanoimprint transfer using a mold, micro fluid chips can be easily mass-produced. However, in the case where micro fluid chips having a micro flow path with high hydrophilicity are mass-produced, even when the method described in Patent Literature 3 above is used, it is necessary to perform the treatment described in Patent Literatures 1 and 2 above on the micro flow path of the individual micro fluid chip. Hence, when it is attempted to mass-produce micro fluid chips having an area with high hydrophilicity, even the method described in Patent Literature 3 above cannot be said to be a preferred method.

Thus, the present invention has been made in view of the issue mentioned above, and an object of the present invention is to provide a new and improved master for micro flow path creation, a new and improved transfer copy, and a new and improved method for producing a master for micro flow path creation by which transfer copies having an area with high hydrophilicity can be easily mass-produced.

Solution to Problem

According to an aspect of the present invention in order to achieve the above object, there is provided a master for micro flow path creation including: a base material; a main concave-convex portion provided on a surface of the base material and extending in a planar direction of the base material; and a fine concave-convex portion provided on a surface of the main concave-convex portion and having a narrower pitch than the main concave-convex portion. The fine concave-convex portion has an arithmetic average roughness of 10 nm to 150 nm and has a specific surface area ratio of 1.1 to 3.0.

The main concave-convex portion may have a width and a depth of 1 µm to 2000 µm, and the fine concave-convex portion may have a width and a depth of 30 nm to 1000 nm.

A plurality of the fine concave-convex portions may be provided. The widths and the depths of the fine concave-convex portions may be values different between positions where the fine concave-convex portion is formed.

The fine concave-convex portion may be provided so as to extend along a longitudinal direction of the main concave-convex portion.

According to another aspect of the present invention in order to achieve the above object, there is provided a method for producing a master for micro flow path creation, including: forming, on a surface of a base material, a main concave-convex portion extending in a planar direction of the base material; and forming, on a surface of the main concave-convex portion, a fine concave-convex portion having a narrower pitch than the main concave-convex portion, by irradiating the surface of the main concave-convex portion with ultrashort pulse laser light having a pulse width of 10 picoseconds or less.

The ultrashort pulse laser light may be applied such that a polarization direction is orthogonal to a longitudinal direction of the main concave-convex portion.

According to still another aspect of the present invention in order to achieve the above object, there is provided a transfer copy including a resin layer to which a surface shape of the above master for micro flow path creation is transferred.

According to still another aspect of the present invention in order to achieve the above object, there is provided a transfer copy including: a resin layer, a main concave-convex portion provided on a surface of the resin layer and extending in a planar direction of the resin layer; and a fine concave-convex portion provided on a surface of the main concave-convex portion and having a narrower pitch than the main concave-convex portion. The fine concave-convex portion has an arithmetic average roughness of 10 nm to 150 nm and has a specific surface area ratio of 1.1 to 3.0.

The main concave-convex portion may have a width and a depth of 1 μm to 2000 μm, and the fine concave-convex portion may have a width and a depth of 30 nm to 1000 nm.

A plurality of fine concave-convex portions may be provided. The widths and the depths of the fine concave-convex portions may be values different between positions where the fine concave-convex portion is formed.

The fine concave-convex portion may be provided so as to extend along a longitudinal direction of the main concave-convex portion.

The resin layer may be made of a hardenable hydrophilic resin.

According to still another aspect of the present invention in order to achieve the above object, there is provided a micro fluid chip including the above transfer copy.

According to the present invention, transfer copies having an area with high hydrophilicity can be easily mass-produced.

Advantageous Effects of Invention

As described above, according to the present invention, transfer copies having an area with high hydrophilicity can be easily mass-produced.

BRIEF DESCRIPTION OF DRAWINGS

FIG. 3 is a diagram showing examples of the planar shape of the main concave-convex portion 11 according to the present embodiment (part 1).

FIG. 6 is a diagram for describing the production process of the master 1 according to the present embodiment.

FIG. 8 is a diagram showing examples of the irradiation direction of ultrashort pulse laser light in the production process of the master 1.

FIG. 11 is a diagram showing the production process of the transfer copy 5 according to the present embodiment.

DESCRIPTION OF EMBODIMENTS

Figure 1:
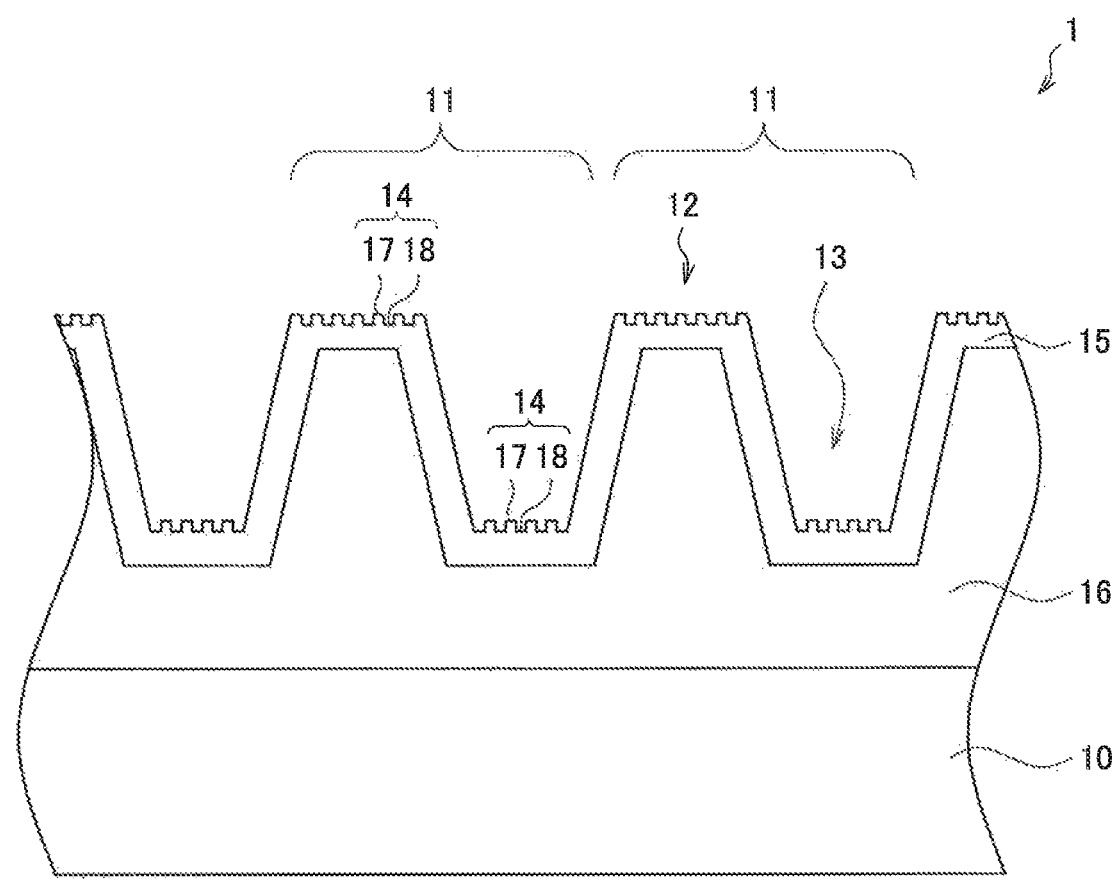
FIG. 1 is a cross-sectional view of a master 1 according to an embodiment of the present invention.

Hereinbelow, preferred embodiments of the present invention are described in detail with reference to the appended drawings. In the present specification and the drawings, constituent elements having substantially the same functional configuration are marked with the same reference numerals, and a repeated description is omitted. Further, the drawings are schematic ones for describing the invention and promoting the understanding thereof, and the shapes, dimensions, ratios, etc. may be illustrated differently from the actual ones; design changes may be made to the shapes etc. with consideration of the following description and known art, as appropriate.

<Master 1>

A master 1 is a master for creating a micro flow path, and is used for imprint transfer, including a roll-to-roll system etc. That is, the concave-convex shape provided on the surface of the master 1 is transferred, and thereby a transfer copy 5 is produced. In the case where the transfer copy 5 has been obtained by imprint transfer using the master 1, concavities and convexities of a shape in which the concave-convex shape provided on the surface of the master 1 is inverted are formed on the surface of the transfer copy 5. The concavity formed on the surface of the transfer copy 5 serves as a micro flow path.

The master 1 may not only be used when a transfer copy 5 as a product, such as a micro fluid chip, is produced, but also be used when a replica master is created by the imprint transfer method. The replica master has concavities and convexities of a shape in which the concave-convex shape provided on the surface of the master 1 is inverted; by further performing imprint transfer using the replica master, a transfer copy 5 as a product can be produced.

First, the master 1 according to an embodiment of the present invention is described with reference to FIG. 1. FIG. 1 is a diagram schematically showing a cross section of the master 1 according to the present embodiment taken along the thickness direction.

As shown in FIG. 1, the master 1 according to the present embodiment includes a flat plate-like base material 10, a surface layer 16 stacked on the base material 10, a plurality of main concave-convex portions 11 provided on the surface of the surface layer 16 and extending in the planar direction of the base material 10, a coating layer 15 covering the surface of the plurality of main concave-convex portions 11, and a plurality of fine concave-convex portions 14 provided on the coating layer 15 of the surface of the plurality of main concave-convex portions 11 and having a narrower pitch (period) than the main concave-convex portions 11. The master 1 may not include the surface layer 16; in this case, the main concave-convex portion 11 is provided directly on the surface of the base material 10. Further, the master 1 may not include the coating layer 15; in this case, the fine concave-convex portion 14 is provided directly on the surface of the surface layer 16.

The base material 10 is not limited to being in a flat plate-like shape like that shown in FIG. 1, and may be in a circular cylindrical shape or a circular columnar shape. In this case, the surface layer 16 and the main concave-convex portion 11 are provided on the outer peripheral surface of the base material 10. The master 1 in a circular cylindrical shape or a circular columnar shape like this may be used in the imprint transfer method of a roll-to-roll system.

The material of the base material 10 is not particularly limited, and a metal such as stainless steel, Cu, Al, or Ni, quartz glass ($SiO_2$) such as fused quartz glass or synthetic quartz glass, a semiconductor material, a resin, etc. may be used. Alternatively, a stacked material in which these materials are stacked may be used.

The material of the surface layer 16 is not particularly limited, and a metal such as NiP, Ni, Cu, or Al, or a stacked material of these may be used. The thickness of the surface layer 16 is not particularly limited, and may be 50 μm to 300 μm, for example.

The material of the coating layer 15 is not particularly limited, and a metal such as Cu, Cr, Ni, NiP, or Al, or a carbon material such as diamond-like carbon (DLC) may be used. The thickness of the coating layer 15 is not particularly limited, and may be 0.1 μm to 300 μm, for example.

Figure 2:
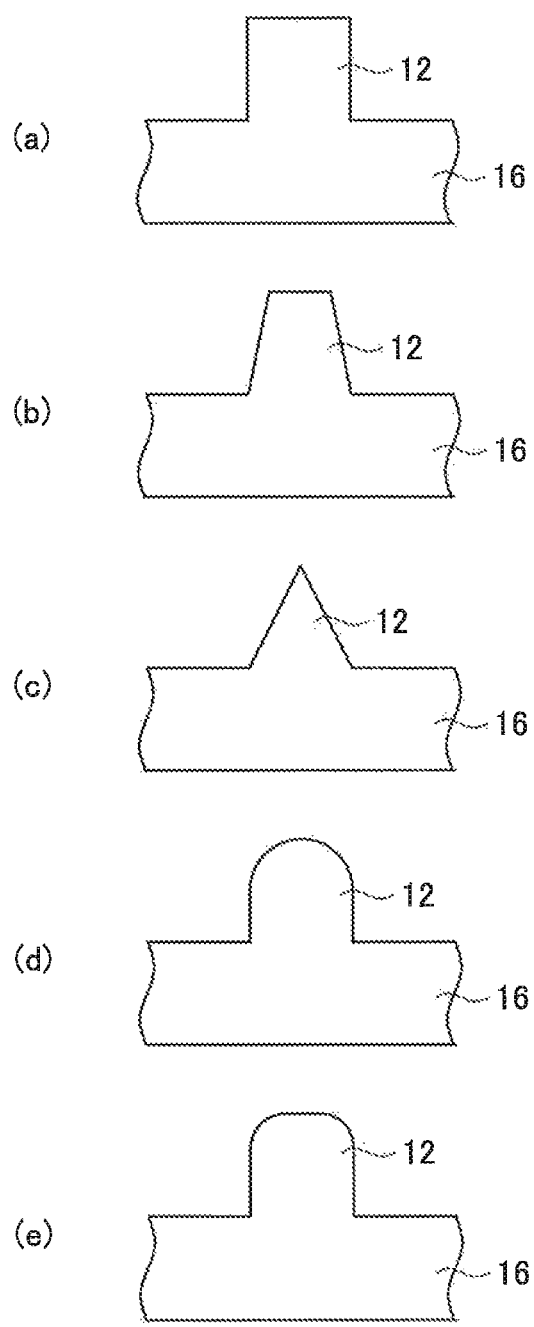
FIG. 2 is a diagram showing examples of the cross-sectional shape of a main concave-convex portion 11 according to the present embodiment.

The main concave-convex portion 11 is provided on the surface of the surface layer 16 or the surface of the base material 10, extends in the planar direction of the base material 10, and has a convexity 12 and a concavity 13. Specifically, one main concave-convex portion 11 has one convexity 12 and one concavity 13. The cross-sectional shape of the convexity 12 is not limited to a shape like that shown in FIG. 1, and may be various shapes as described below. The cross-sectional shape of the convexity 12 refers to the contour shape of the surface of the convexity 12 in a cross section of the base material 10. Other cross-sectional shapes of the convexity 12 will now be described using FIG. 2. FIG. 2 is a diagram schematically showing cross sections of the convexity 12 when the master 1 according to the present embodiment is cut along the thickness direction. In FIG. 2, the fine concave-convex portion 14 provided on the surface of the convexity 12, the coating layer 15, and the base material 10 are not illustrated, for the sake of simplicity. FIG. 2(*a*) is an example of a rectangular convexity 12. FIG. 2(*b*) is an example of a trapezoidal convexity 12 in which the upper base is shorter than the lower base. FIG. 2(*c*) is an example of a triangular convexity 12 in which a vertex is located on the upper side. FIG. 2(*d*) is an example of a semicircular convexity 12 in which an arc is located on the upper side. Further, FIG. 2(*e*) is an example of a convexity 12 having an approximately rectangular cross-sectional shape in which the corner portion is in a curved line. That is, the cross-sectional shape of the convexity 12 according to the present embodiment may be a polygon such as a triangle or a quadrangle, a figure in which the corner portion of a polygon is in a curved line, or a figure including a curved line, such as a circle or an ellipse. Further, the cross-sectional shape may be a shape that can be regarded as approximately any of these shapes, and may be an asymmetric shape. Further, similarly to the cross-sectional shape of the convexity 12, the cross-sectional shape of the concavity 13 forming a pair with the convexity 12 is not limited to a shape like that shown in FIG. 1, either, and may be various shapes.

The planar shape of the main concave-convex portion 11 is not particularly limited, and may be various shapes. Here, the planar shape of the main concave-convex portion 11 refers to the shape of the main concave-convex portion 11 when the surface of the base material 10 is viewed from above the surface of the base material 10, i.e., what is called a shape in a planar view. The planar shape of the main concave-convex portion 11 will now be described using FIG. 3. FIG. 3 is a diagram schematically showing planar shapes of the main concave-convex portion 11 according to the present embodiment. FIG. 3(*a*) is an example of a straight-lined main concave-convex portion 11 extending in the planar direction of the base material 10. FIG. 3(*b*) is an example of a curved-lined main concave-convex portion 11. FIG. 3(*c*) is an example of a main concave-convex portion 11 having a shape that is bent so as to form an obtuse angle in the planar direction of the base material 10. That is, the planar shape of the main concave-convex portion 11 according to the present embodiment is not particularly limited, and may be a straight-lined shape or a curved-line shape, or may be a bent shape or a branched shape.

The width and the depth of the main concave-convex portion 11 are not particularly limited, and may be 1 μm to 2000 μm, for example. Here, the width and the depth of the main concave-convex portion 11 are the width and the depth (height) of the convexity 12 and the concavity 13. Further, the width of the convexity 12 refers to the width of the bottom of the convexity 12 in a cross section of the master 1 taken along the direction perpendicular to the longitudinal direction of the main concave-convex portion 11, and the width of the concavity 13 refers to the width of the bottom surface of the concavity 13 in a similar cross section. The depth (height) of the convexity refers to the length from the bottom to the upper end (upper end surface) in a similar cross section, and the depth of the concavity refers to the length from the bottom to the upper end (opening surface) in a similar cross section. The convexity 12 or the concavity 13 may have a uniform width in one convexity 12 or one concavity 13, or may have widths different between positions in one convexity 12 or one concavity 13.

The fine concave-convex portion 14 shown in FIG. 1 is provided on the coating layer 15 of the surface of the main concave-convex portion 11, has a fine convexity 17 and a fine concavity 18, and has a narrower pitch (period) than the main concave-convex portion 11. Specifically, one fine concave-convex portion 14 has one fine convexity 17 and one fine concavity 18. As shown in FIG. 1, the fine concave-convex portion 14 is provided on the upper surface of the convexity 12 and the bottom surface of the concavity 13. The fine concave-convex portion 14 is not limited to being provided on both of the upper surface of the convexity 12 and the bottom surface of the concavity 13, and may be provided on either one of them. The fine concave-convex portion 14 is preferably provided on the upper surface of the convexity 12.

The width and the depth of the fine concave-convex portion 14 are not particularly limited, and may be 30 nm to 1000 nm, for example. Here, the width and the depth of the fine concave-convex portion 14 are the width and the depth (height) of the fine convexity 17 and the fine concavity 18. Here, the definition of the width and the depth of the fine convexity 17 and the width and the depth of the fine concavity 18 is similar to the definition of those of the convexity 12 and the concavity 13 described above. In the case where the master 1 has a plurality of fine concave-convex portions 14, the width and the depth of the fine concave-convex portion 14 may be values different between positions where the fine concave-convex portion 14 is formed.

The surface of the main concave-convex portion 11 provided with the fine concave-convex portion 14 has an arithmetic average roughness (Ra) of 10 nm to 150 nm. Here, the arithmetic average roughness can be found in the following manner. The shape in an area 3 μm square of the surface of the main concave-convex portion 11 is measured with an atomic force microscope (AFM), and the arithmetic average roughness Ra is calculated in accordance with JIS B0601-2001.

The surface of the main concave-convex portion 11 provided with the fine concave-convex portion 14 has a specific surface area ratio of 1.1 to 3.0. Here, the specific surface area ratio can be found in the following manner. An area 3 μm square of the surface of the main concave-convex portion 11 is observed with an AFM to measure the actually measured surface area Sa of the surface, and the ratio of the actually measured surface area Sa to the surface area Sm on the assumption that the surface is an ideal flat surface (mirror surface) relative to Sa is calculated; thus, the specific surface area ratio can be found.

Figure 4:
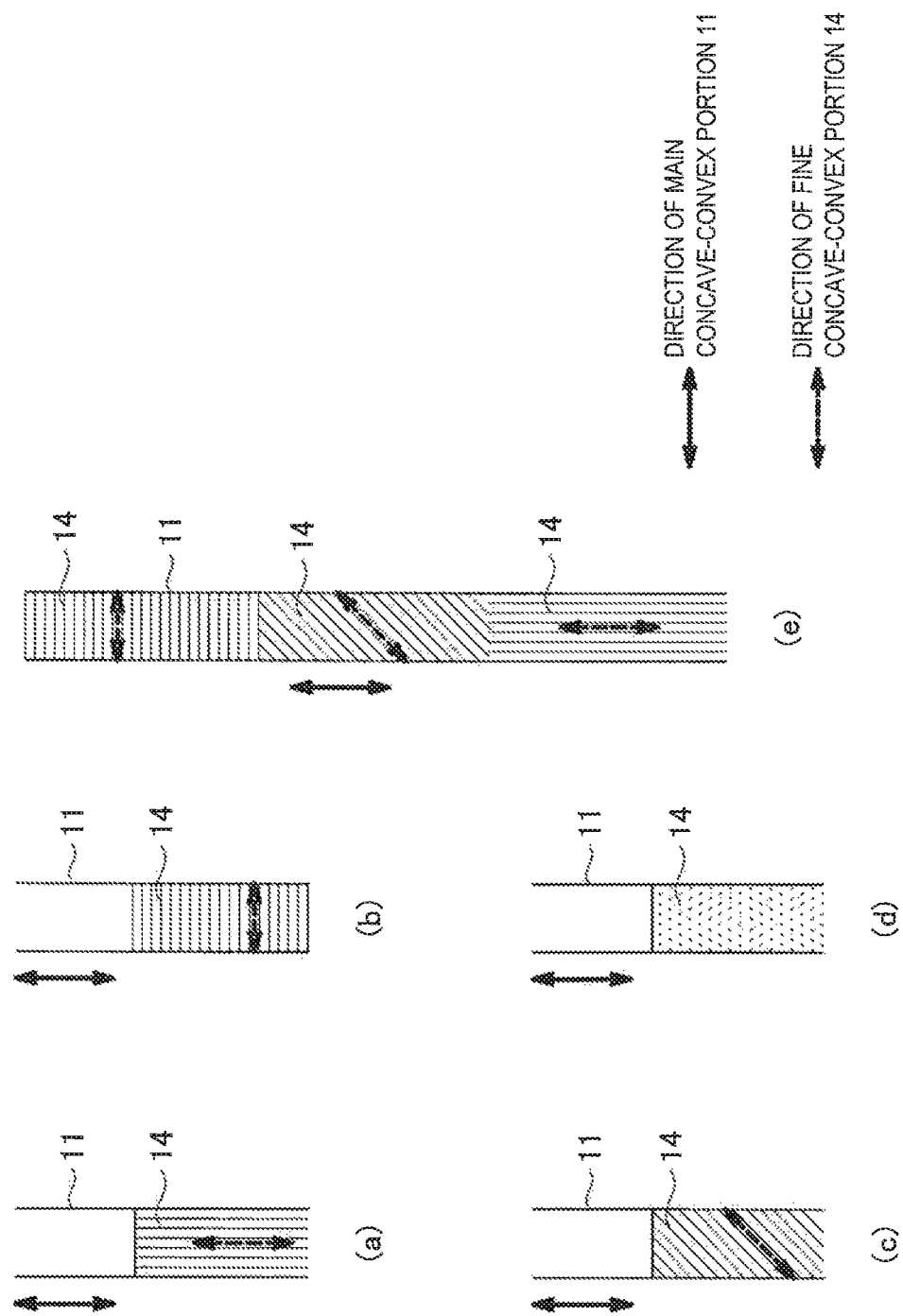
FIG. 4 is a diagram showing examples of the planar shape of the main concave-convex portion 11 according to the present embodiment (part 2).

The formation direction of the fine concave-convex portion 14 is not particularly limited, and may be various directions as described below. Here, the formation direction of the fine concave-convex portion 14 refers to the longitudinal direction of the fine concave-convex portion 14 when the surface of the base material is viewed from above the surface of the base material 10. For example, the fine concave-convex portion 14 shown in FIG. 3(a) is provided so as to extend in a straight line along the longitudinal direction of a straight-lined main concave-convex portion 11. In this case, the formation direction of the fine concave-convex portion 14 is a direction along the longitudinal direction of the main concave-convex portion 11. Further, the fine concave-convex portions 14 shown in FIG. 3(b) and FIG. 3(c) are provided so as to extend along the longitudinal direction of a curved-lined or bent main concave-convex portion 11; also in these cases, similarly to FIG. 3(a), the formation direction of the fine concave-convex portion 14 is a direction along the longitudinal direction of the main concave-convex portion 11. Other aspects of the fine concave-convex portion 14 will now be described using FIG. 4. FIG. 4 is a diagram schematically showing other planar shapes of the main concave-convex portion 11 according to the present embodiment. FIG. 4(a) is, similarly to FIG. 3(a), an example of a fine concave-convex portion 14 having a formation direction along the longitudinal direction of a straight-lined main concave-convex portion 11. FIG. 4(b) is an example of the fine concave-convex portion 14 in the case where the formation direction of the fine concave-convex portion 14 is orthogonal to the longitudinal direction of a straight-lined main concave-convex portion 11. FIG. 4(c) is an example of the fine concave-convex portion 14 in the case where the formation direction of the fine concave-convex portion 14 is inclined with respect to the longitudinal direction of a straight-lined main concave-convex portion 11.

Further, the planar shape of the fine concave-convex portion 14 is not limited to linear shapes like the examples described above, and may be various shapes. For example, as shown in FIG. 4(d), the fine concave-convex portion 14 may be in a dotted form or a network form. Further, as shown in FIG. 4(e), the fine concave-convex portion 14 may have formation directions and shapes different between positions in the main concave-convex portion 11.

<Transfer Copy 5>

Figure 5:
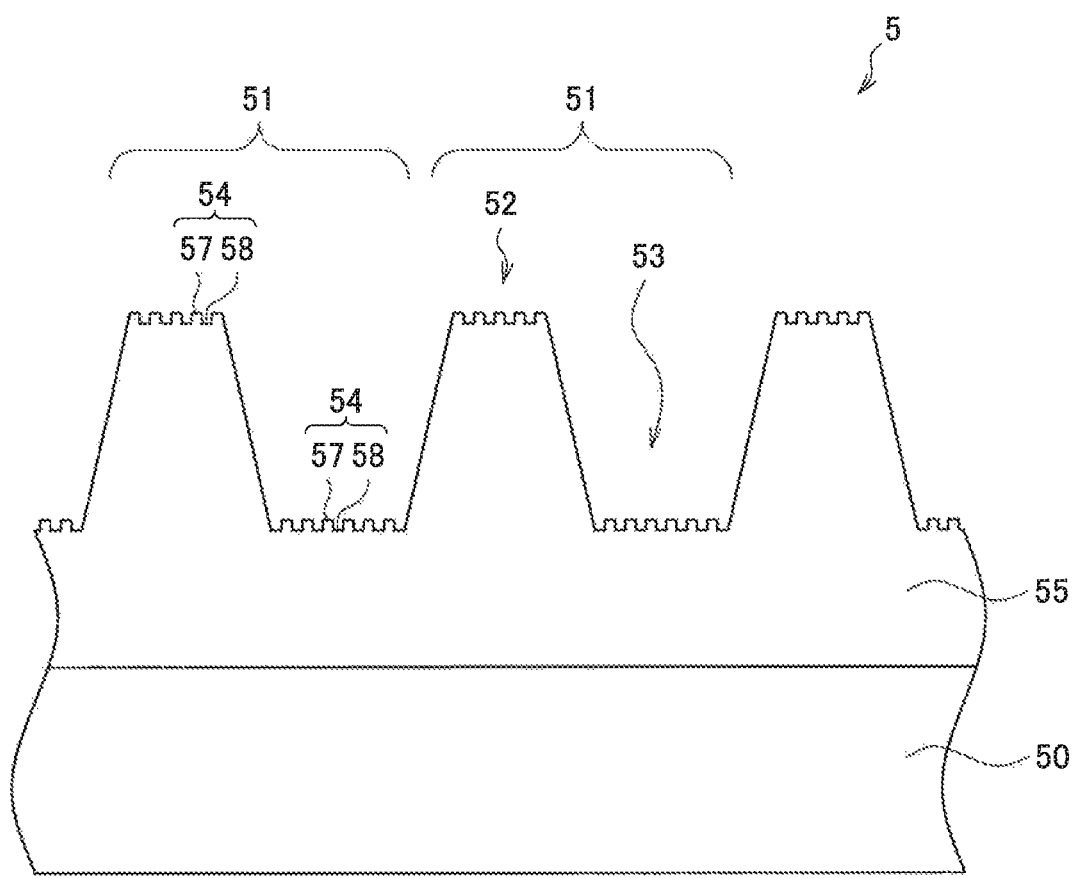
FIG. 5 is a cross-sectional view of a transfer copy 5 according to the present embodiment.

A transfer copy 5 produced by performing imprint transfer using the master 1 according to the present embodiment will now be described. First, the transfer copy 5 according to an embodiment of the present invention is described with reference to FIG. 5. FIG. 5 is a diagram schematically showing a cross section of the transfer copy 5 according to the present embodiment taken along the thickness direction.

As shown in FIG. 5, the transfer copy 5 according to the present embodiment includes a resin layer 55 to which the surface shape of the master 1 according to the present embodiment is transferred. Specifically, the transfer copy includes a flat plate-like base material 50, the resin layer 55 provided on the surface of the base material 50, a main concave-convex portion 51 provided on the surface of the resin layer 55 and extending in the planar direction of the resin layer 55, and a fine concave-convex portion 54 provided on the surface of the main concave-convex portion 51 and having a narrower pitch than the main concave-convex portion 51.

The material of the base material 50 is not particularly limited, and a resin, quartz glass such as fused quartz glass or synthetic quartz glass, a semiconductor material, or a metal such as stainless steel may be used. Alternatively, a stacked material in which these materials are stacked may be used. A material with high adhesiveness to the resin layer 55 described later is preferable as the material of the base material 50.

The size of the base material 50 is not particularly limited, and may be a size that the base material of the transfer copy 5 having a micro flow path generally has.

A hardenable hydrophilic resin 56 that is the composition of the resin layer 55 has hydrophilicity, and is a resin having a hardening type of either a photocurable type or a thermosetting type. The resin layer 55 is preferably a photocurable hydrophilic resin 56 that is a resin that decreases in fluidity and cures by being irradiated with light of a prescribed wavelength. The photocurable hydrophilic resin 56 is, for example, an ultraviolet curable resin such as an acrylic resin acrylate. The hardenable hydrophilic resin 56 may contain an initiator, a filler, a functional additive, a solvent, an inorganic material, a pigment, an antistatic agent, a sensitizing dye, etc., as necessary. The thickness of the resin layer 55 is not particularly limited, and may be 0.1 μm to 300 μm, for example.

The main concave-convex portion 51 is provided on the surface of the resin layer 55, extends in the planar direction of the resin layer 55, and has a convexity 52 and a concavity 53. Specifically, one main concave-convex portion 51 has one convexity 52 and one concavity 53. The cross-sectional shape of the concavity 53 included in the main concave-convex portion 51 is not limited to a shape like that shown in FIG. 5, and may be various shapes in accordance with the cross-sectional shape of the convexity 12 of the master 1 because the concavity 53 has a shape in which the cross-sectional shape of the convexity 12 of the master 1 is inverted. The cross-sectional shape of the concavity 53 refers to the contour shape of the space in the concavity 53 in a cross section of the transfer copy 5. Also the cross-sectional shape of the convexity 52 forming a pair with the concavity 53 may be various shapes in accordance with the cross-sectional shape of the concavity 13 of the master 1.

The planar shape and the formation direction of the main concave-convex portion 51 are not particularly limited, and may be various shapes and formation directions in accordance with the planar shape of the main concave-convex portion 11 of the master because the main concave-convex portion 51 has a shape to which the planar shape of the main concave-convex portion 11 of the master 1 is transferred.

The main concave-convex portion 51 has the inverted shape of the main concave-convex portion 11 of the master 1. Therefore, the width and the depth (height) of the main concave-convex portion 51 are values close to the width and the depth (height) of the main concave-convex portion 11 of the master 1. Also the definition of the width and the depth of the main concave-convex portion 51 is similar to the definition of the width and the height of the main concave-convex portion 11. Specifically, the width and the depth of the convexity 52 and the concavity 53 may be, for example, 1 µm to 2000 µm on the basis of the main concave-convex portion 11 of the master 1. The plurality of main concave-convex portions 51 preferably have the same width, and are preferably formed on the base material 50 with the same pitch (period) along the planar direction of the base material 50, similarly to the main concave-convex portion 11 of the master 1. Also the size of the pitch may be, for example, 1 µm to 2000 µm on the basis of the main concave-convex portion 11 of the master 1.

The fine concave-convex portion 54 is provided on the surface of the main concave-convex portion 51, has a fine convexity 57 and a fine concavity 58, and has a narrower pitch (period) than the main concave-convex portion 51. Specifically, one fine concave-convex portion 54 has one fine convexity 57 and one fine concavity 58. The fine concave-convex portion 54 is formed by the transfer of the shape of the fine concave-convex portion 14 of the master 1, and therefore has a cross-sectional shape in which the cross-sectional shape of the fine concave-convex portion 14 of the master 1 is inverted and has a planar shape to which the planar shape of the fine concave-convex portion 14 of the master 1 is transferred. As shown in FIG. 5, the fine concave-convex portion 54 is provided on the upper surface of the convexity 52 and the bottom surface of the concavity 53. The fine concave-convex portion 54 is not limited to being provided on both of the upper surface of the convexity 52 and the bottom surface of the concavity 53, and may be provided on either one of them. The fine concave-convex portion 54 is preferably provided on the bottom surface of the concavity 53.

The fine concave-convex portion 54 has the inverted shape of the fine concave-convex portion 14 of the master 1. Therefore, the width and the depth (height) of the fine concave-convex portion 54 are values close to the width and the depth (height) of the fine concave-convex portion 14 of the master 1. Also the definition of the width and the depth of the fine concave-convex portion 54 is similar to the definition of the width and the height of the fine concave-convex portion 14. Specifically, the width and the depth of the fine convexity 57 and the fine concavity 58 may be 30 nm to 1000 nm. In the case where the transfer copy 5 has a plurality of fine concave-convex portions 54, the width and the depth of the fine concave-convex portion 54 may be values different between positions where the fine concave-convex portion 54 is formed.

The surface of the main concave-convex portion SI provided with the fine concave-convex portion 54 has an arithmetic average roughness of 10 nm to 150 nm. Here, the arithmetic average roughness can be found in a similar manner to the arithmetic average roughness of the surface of the main concave-convex portion 11 of the master 1. Further, the surface of the main concave-convex portion 51 provided with the fine concave-convex portion 54 has a specific surface area ratio of 1.1 to 3.0. Here, the specific surface area ratio can be found in a similar manner to the specific surface area ratio of the surface of the main concave-convex portion 11 of the master 1.

The formation direction of the fine concave-convex portion 54 is not particularly limited, and may be various directions in accordance with the planar shape of the fine concave-convex portion 14 of the master 1 because the fine concave-convex portion 54 has a planar shape to which the planar shape of the fine concave-convex portion 14 of the master 1 is transferred. Here, the formation direction of the fine concave-convex portion 54 is defined similarly to that of the fine concave-convex portion 14 of the master 1. For example, the fine concave-convex portion 54 may be provided so as to extend in a straight line along the longitudinal direction of a straight-lined main concave-convex portion 51. In this case, the formation direction of the fine concave-convex portion 54 is a direction along the longitudinal direction of the straight-lined main concave-convex portion 51. Even when the shape of the main concave-convex portion 51 is a curved-lined shape or a bent shape, the fine concave-convex portion 54 may be provided in the plane of the base material 50 along the direction in which the main concave-convex portion 51 extends, and also the formation direction of the fine concave-convex portion 54 in this case is a direction along the longitudinal direction of the main concave-convex portion 51. Further, the formation direction of the fine concave-convex portion 54 may, similarly to that of the fine concave-convex portion 14 of the master 1, be a direction orthogonal to the longitudinal direction of a straight-lined main concave-convex portion 51, be a direction inclined with respect to the longitudinal direction of a straight-lined main concave-convex portion 51, or be a combination of these. Further, the planar shape of the fine concave-convex portion 54 is not limited to linear shapes like the examples described above, and may be a dotted form or a network form.

As described above, the transfer copy 5 according to the present embodiment has the main concave-convex portion 51 and the fine concave-convex portion 54 formed by the transfer of the main concave-convex portion 11 and the fine concave-convex portion 14 of the master 1. By the fine concave-convex portion 54 being provided on the surface of the main concave-convex portion 51 of the transfer copy 5, the surface area of the surface of the main concave-convex portion 51 is increased, and the hydrophilicity of the surface of the main concave-convex portion 51 can be enhanced. When fluid flows into the fine concave-convex portion 54, the fluidity of fluid in the main concave-convex portion 51 changes due to an action at the interface between the fluid and the fine concave-convex portion 54. Thus, the ease of flowing (flow velocity) of the fluid flowing through the main concave-convex portion 51 can be controlled by changing the shape of the fine concave-convex portion 54. Further, in the case where fine concave-convex portions 54 having shapes different between positions are provided on the main concave-convex portion 51, the flow velocity of fluid changes in accordance with the shape of the fine concave-convex portion 54.

That is, in the transfer copy 5 according to the present embodiment, the hydrophilicity of the surface of the main concave-convex portion 51 can be enhanced by the fine concave-convex portion 54 being provided on the surface of the main concave-convex portion 51. Further, the ease of flowing of the fluid flowing through the main concave-convex portion 51 can be easily controlled by changing the shape of the fine concave-convex portion 54.

<Micro Fluid Chip>

A micro fluid chip including the transfer copy 5 according to the present embodiment, such as a micro reactor, can be created. For example, in a micro fluid chip including the transfer copy 5 mentioned above, the concavity 53 of the transfer copy 5 can serve as a micro flow path for passing fluid, or serve as a well for storing fluid. In this case, by the fine concave-convex portion 54 being provided on the bottom surface of the concavity 53 of the transfer copy 5, the surface area of the bottom surface of the concavity 53 is increased, and the hydrophilicity of the bottom surface of the concavity 53 can be enhanced. Further, when fluid flows into the fine concave-convex portion 54 of the bottom surface of the concavity 53, the fluidity of fluid changes due to an action at the interface between the fluid and the fine concave-convex portion 54. Thus, the ease of flowing of the fluid flowing through the concavity 53 can be controlled by changing the shape of the fine concave-convex portion 54. Hence, the shape of the fine concave-convex portion 54 may be selected in accordance with the properties of the fluid flowing through the concavity 53.

Further, a substrate may be spread over the concavity 53 of the transfer copy 5, and thereby a micro fluid chip usable as a capillary can be created.

<Method for Producing Master 1>

A method for producing the master 1 according to the present embodiment will now be described with reference to FIG. 6. FIG. 6 shows a flow chart of a method for producing the master 1 according to the present embodiment, and shows a diagram schematically showing a cross section of the master 1 in each step taken along the thickness direction as well.

First, in step S101, the surface layer 16 is formed on the surface of the base material 10 using a method such as plating such as electrolytic plating or electroless plating. This step S101 of forming the surface layer 16 may be omitted.

Next, in step S102, the surface of the surface layer 16 is subjected to mirror cutting using a diamond bit or the like with an ultraprecision cutting machine, and the surface of the surface layer 16 or the surface of the base material 10 is planarized. This step is not limited to mirror cutting using a diamond bit, and mirror grinding using fixed abrasive grains or polishing using free abrasive grains may be used.

Further, in step S103, using a diamond bit or the like with an ultraprecision cutting machine, the main concave-convex portion 11 extending in the planar direction of the base material 10 is formed on the surface of the surface layer 16 or the surface of the base material 10. This step is not limited to ultraprecision cutting using a diamond bit, and photolithography processing or laser processing may be used. Further, it is also possible to use, as the base material 10, a structure transferred by electroforming from a mold on which a concave-convex structure corresponding to the main concave-convex portion 11 is formed.

Next, in step S104, the coating layer 15 that covers the surface of the main concave-convex portion 11 is formed using a method such as plating such as electrolytic plating or electroless plating, sputtering, vapor deposition, ion plating, CVD (chemical vapor deposition), spin coating, application, slit coating, dip coating, or spray coating. This step S104 of forming the coating layer 15 may be omitted.

Then, in step S105, using a laser processing apparatus 8, the surface of the main concave-convex portion 11 is irradiated with ultrashort pulse laser light having a pulse width of 10 picoseconds or less, and the fine concave-convex portion 14 having a narrower pitch than the main concave-convex portion 11 is formed on the surface of the main concave-convex portion 11; thus, the master 1 is produced. Details of the laser processing apparatus 8 are described later. The shape etc. of the fine concave-convex portion 14 change with irradiation conditions of laser light such as the laser light wavelength, the repetition frequency, the pulse width, the fluence, the number of pulses, the beam size, the scanning speed, the scanning direction, the beam scanning pitch, and the polarization direction; hence, these irradiation conditions are selected so that a desired fine concave-convex portion 14 is obtained. To improve the hydrophilicity of the transfer copy 5, it is preferable that the fluence per shot of ultrashort pulse laser light during the creation of the master 1 be larger than 0.16 J/cm$^2$. Depending on the structure of the main concave-convex portion 11, the applied laser light makes interference and diffraction, and the laser light intensity on the surface of the main concave-convex portion 11 periodically changes in accordance with the position. By such a periodic change in laser light intensity, fine concave-convex portions 14 different in width and depth in accordance with the position can be formed on the surface of the main concave-convex portion 11. This periodic change in laser light intensity can be found by calculation on the basis of the shape of the main concave-convex portion 1 and the wavelength of laser light. Therefore, the irradiation conditions mentioned above can be optimally selected, and a desired fine concave-convex portion 14 can be formed on the master 1. Further, by producing the transfer copy 5 using the master 1 having a desired fine concave-convex portion 14, a fine concave-convex portion 54 optimized in accordance with the properties of the fluid used in the transfer copy 5 can be formed on the surface of the transfer copy 5.

Figure 7:
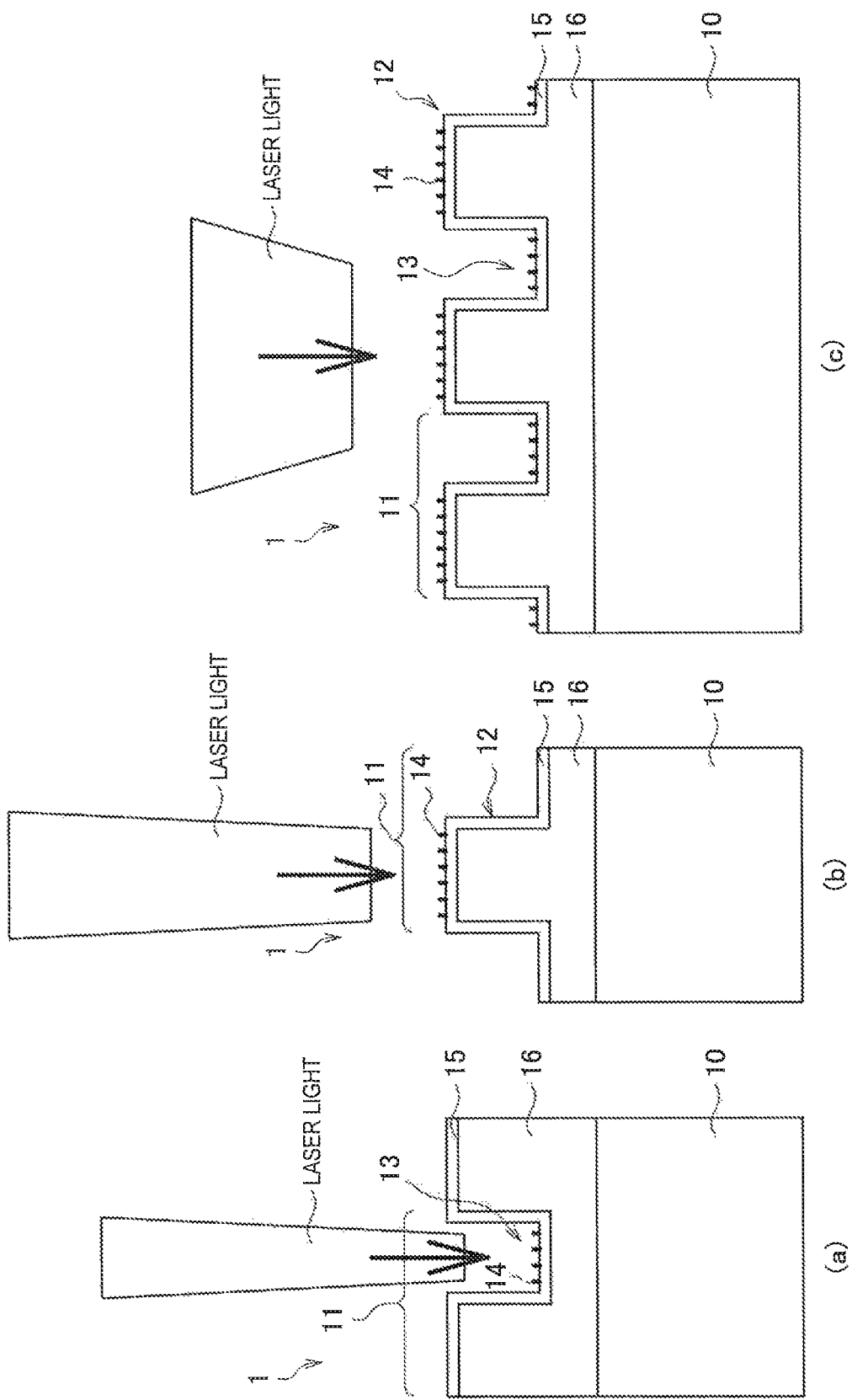
FIG. 7 is a diagram showing examples of the spot width and the irradiation method of ultrashort pulse laser light in the production process of the master 1.

The spot width of laser light can be controlled by using a lens etc. The spot width of laser light will now be described using FIG. 7. FIG. 7 is a diagram showing spot widths and irradiation methods of ultrashort pulse laser light in the production process of the master 1. FIG. 7($a$) is a case where the spot width of laser light is set small and laser light is applied only to the bottom surface of the concavity 13 of the master 1. In this case, the fine concave-convex portion 14 is formed only on the bottom surface of the concavity 13 of the master 1. FIG. 7($b$) is a case where the spot width of laser light is set small similarly to FIG. 7($a$) and laser light is applied only to the upper surface of the convexity 12. In this case, the fine concave-convex portion 14 is formed only on the upper surface of the convexity 12. Alternatively, as shown in FIG. 7($c$), laser light may be applied to the entire surface of the main concave-convex portion 11 without reducing the spot width of laser light. In this case, the fine concave-convex portion 14 is formed on both the bottom surface of the concavity 13 and the upper surface of the convexity 12.

The scanning direction of laser light is not particularly limited, and the scanning direction may be controlled so that a desired fine concave-convex portion 14 is formed. The scanning direction of laser light will now be described using FIG. 8. FIG. 8 is a diagram showing examples of the irradiation direction of ultrashort pulse laser light in the production process of the master 1. In FIG. 8, also the polarization direction of laser light is illustrated. FIG. 8($a$) shows an example of the scanning direction of laser light in the case where scanning is performed along the main concave-convex portion 11 extending in the planar direction of the base material 10. FIG. 8($b$) shows an example of the scanning direction of laser light in the case where scanning is performed along a main concave-convex portion 11 having a planar shape that is curvedly bent on the surface of the base material 10. FIG. 8($c$) shows an example of the scanning direction of laser light in the case where scanning is performed along a main concave-convex portion 11 having a planar shape that is bent so as to form an obtuse angle on the surface of the base material 10. In the examples of FIG. 8($a$) to FIG. 8($c$), the laser light is linearly polarized light, and the polarization direction is orthogonal to the longitudinal direction of the main concave-convex portion 11.

Figure 9:
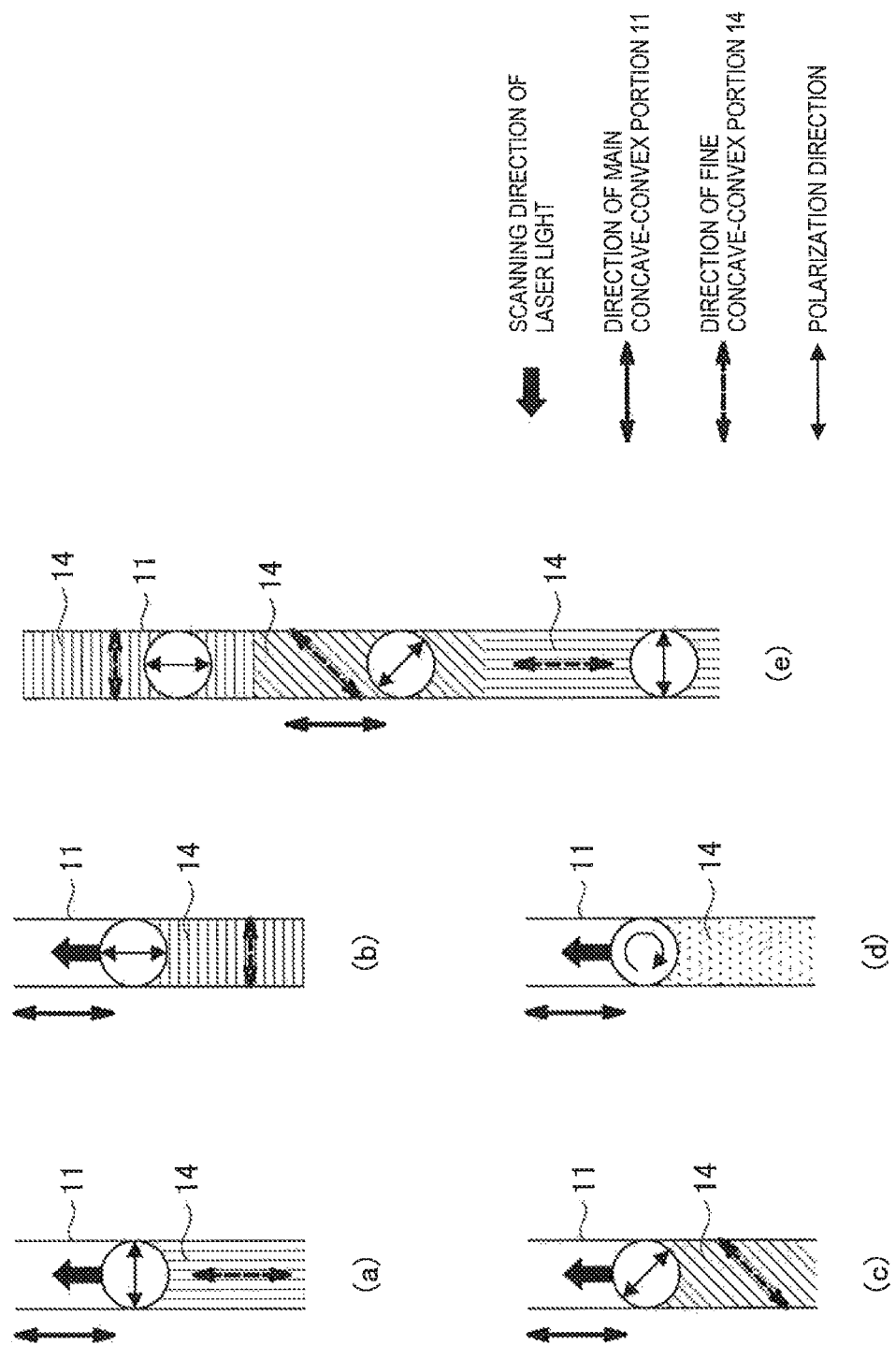
FIG. 9 is a diagram showing examples of the polarization direction and the scanning direction of ultrashort pulse laser light and the planar shape of a fine concave-convex portion 14 in the production process of the master 1.

The laser light may be linearly polarized light, elliptically polarized light, or circularly polarized light. The formation direction, shape, etc. of the fine concave-convex portion 14 can be changed by changing the polarization direction and the scanning direction. The polarization direction and the scanning direction of laser light and the shape of the fine concave-convex portion 14 will now be described using FIG. 9. FIG. 9 is a diagram showing polarization directions and scanning directions of ultrashort pulse laser light and planar shapes of the fine concave-convex portion 14 in the production process of the master 1. FIG. 9(a) is an example of linearly polarized light, and is a case where the polarization direction is set orthogonal to the longitudinal direction of the main concave-convex portion 11 and laser light is scanned along the longitudinal direction of the main concave-convex portion 11. In this case, fine concave-convex portions 14 extending along the longitudinal direction of the main concave-convex portion 11 are formed. FIG. 9(b) is an example of linearly polarized light, and is a case where the polarization direction is set identical to the longitudinal direction of the main concave-convex portion 11 and laser light is scanned along the longitudinal direction of the main concave-convex portion 11. In this case, fine concave-convex portions 14 extending in a direction orthogonal to the longitudinal direction of the main concave-convex portion 11 are formed. FIG. 9(c) is an example of linearly polarized light, and is a case where the polarization direction is set to a direction inclined with respect to the longitudinal direction of the main concave-convex portion 11 and laser light is scanned along the longitudinal direction of the main concave-convex portion 11. In this case, fine concave-convex portions 14 having a direction orthogonal to the polarization direction and inclined with respect to the longitudinal direction of the main concave-convex portion 11 are formed. Further, FIG. 9(d) is a case where circularly polarized light is used and laser light is scanned along the longitudinal direction of the main concave-convex portion 11. In this case, fine concave-convex portions 14 in a dotted form or a network form without anisotropy are formed. FIG. 9(e) is a case where laser light is scanned along the longitudinal direction of the main concave-convex portion 11 while the polarization direction is changed with the position. In this case, fine concave-convex portions 14 having shapes different between positions are formed.

That is, in the method for producing the master 1 according to the present embodiment, a desired fine concave-convex portion 14 can be formed by changing the spot width, the scanning direction, the polarization direction, etc. of laser light. Since the spot width, the scanning direction, the polarization direction, etc. of laser light can be freely controlled, a desired fine concave-convex portion 14 can be easily formed.

(Example of Configuration of Laser Processing Apparatus 8)

An example of the configuration of the laser processing apparatus 8 used in the method for producing the master 1 according to the present embodiment will now be described with reference to FIG. 10.

Figure 10:
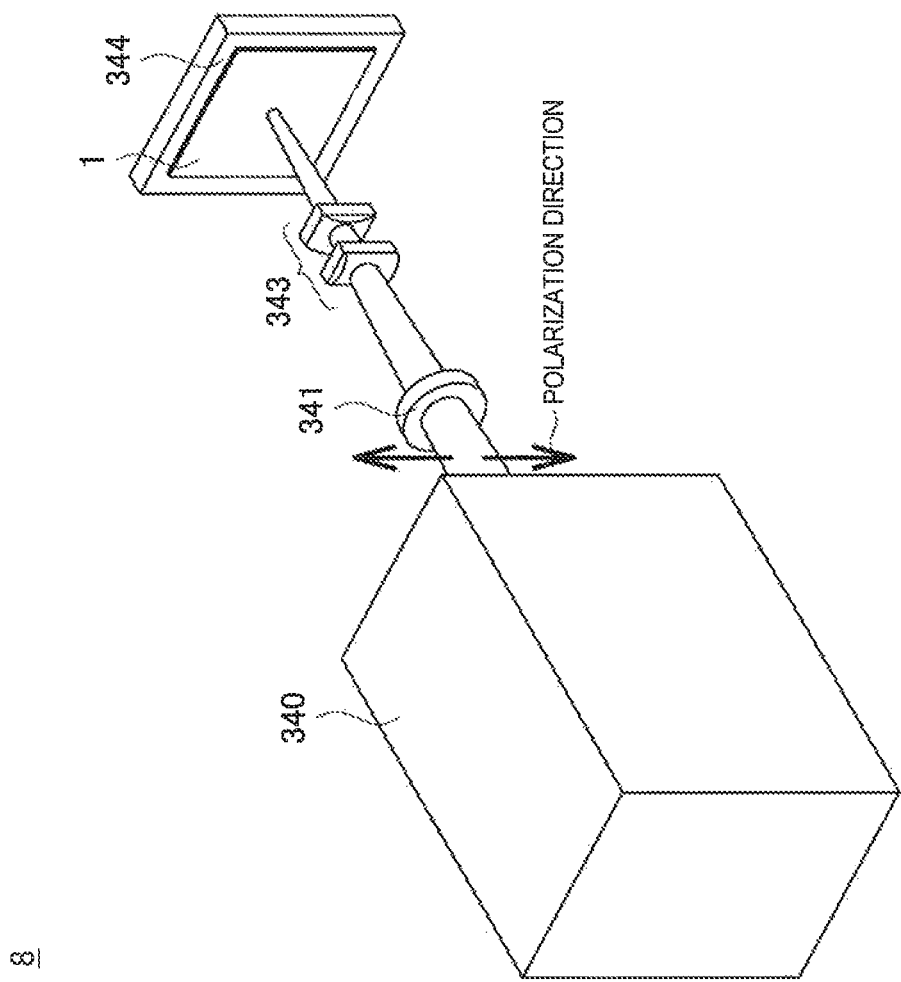
FIG. 10 is a diagram showing an example of the configuration of a laser processing apparatus 8 according to the present embodiment.

FIG. 10 is a schematic diagram showing an example of the configuration of the laser processing apparatus 8 for creating a plate-like master 1. A laser main body 340 is, for example, IFRIT (product name) manufactured by Cyber Laser Inc. The wavelength of laser light used for laser processing is, for example, 800 nm. However, the wavelength of laser light used for laser processing may also be 400 nm, 266 nm, or the like. The repetition frequency is preferably larger in view of the processing time and the narrowing of the pitch of the concavity 13 or the convexity 12 formed, and is preferably 1,000 Hz or more. The pulse width of laser light is preferably shorter, and is preferably approximately 200 femtoseconds ($10^{-15}$ seconds) to 10 picoseconds ($10^{-12}$ seconds).

The laser main body 340 is configured to emit laser light linearly polarized in a perpendicular direction. Hence, in the laser processing apparatus 8 according to the present embodiment, the polarization direction is caused to make rotation etc. using a wave plate 341 (e.g., λ/2 wave plate), and thereby linearly polarized light or circularly polarized light in a desired direction is obtained. Further, in the laser processing apparatus 8, the intensity distribution of laser light is a Gaussian distribution. Further, the laser light is constricted using two orthogonally arranged cylindrical lenses 343, and thereby a desired beam size is obtained. The laser light may be constricted with a spherical lens.

When processing the plate-like master 1, a linear stage 344 is moved at a uniform velocity. When it is intended to perform processing on a surface larger than the size of the beam spot, the beam is scanned and thereby a concave-convex shape is provided to the entire surface intended to be processed.

As a parameter that can be changed in order to obtain a desired fine concave-convex portion 14, fluence is given. The peak value of the energy density per shot (pulse) is used as the fluence in the present embodiment. That is, a beam profile is measured using a beam profiler (SP620U and software BeamStar produced by Ophir Optronics Solutions Ltd.), the cross-sectional profile is subjected to Gaussian fitting, and the peak value of the power density (W/cm$^2$) is divided by the repetition frequency (Hz) of laser light and is thereby converted to the energy density per pulse (J/cm$^2$); the resulting value is used as the fluence. The fluence in the case of a top hat beam can be obtained by performing top hat fitting and similarly finding the energy density from the value of the top of the power density.

That is, a desired fine concave-convex portion 14 can be formed on the coating layer 15 by, in the laser processing apparatus 8 mentioned above, adjusting irradiation conditions of laser light such as the laser light wavelength, the repetition frequency, the pulse width, the fluence, the number of pulses, the beam size, the scanning speed, the scanning direction, the beam scanning pitch, and the polarization direction.

<Method for Producing Transfer Copy 5>

In the present embodiment, the transfer copy 5 is produced by the imprint transfer method using the master 1 according to the present embodiment. Thus, transfer copies 5 having an area with high hydrophilicity can be easily mass-produced by using the imprint transfer method. A method for producing the transfer copy 5 according to the present embodiment will now be described with reference to FIG. 11. FIG. 11 shows a flow chart of a method for producing the transfer copy 5 using the master 1 according to the present embodiment, and shows a diagram schematically showing a cross section of the transfer copy 5 in each step taken along the thickness direction as well.

First, in step S201, cleaning is performed on the master 1. Further, mold release treatment for preventing the adhesion of the hardenable hydrophilic resin 56 is performed on the surface of the main concave-convex portion 11 of the master 1.

Next, in step S202, using a coating apparatus, the hardenable hydrophilic resin 56 is applied to the surface provided with the main concave-convex portion 11 of the master 1, and the resin layer 55 is formed. The coating apparatus includes a coating means such as a gravure coater, a wire bar coater, or a die coater.

Further, in step S203, the base material 50 is pressed against the resin layer 55. At this time, the main concave-convex portion 11 of the master 1 is filled with the hardenable hydrophilic resin 56 that is the composition of the resin layer 55. Further, also the fine concave-convex portion 14 provided on the surface of the main concave-convex portion 11 is filled with the hardenable hydrophilic resin 56.

Next, the hardenable hydrophilic resin 56 is hardened. In the case where the hardenable hydrophilic resin 56 is a thermosetting resin, the resin layer 55 is heated; and in the case where the hardenable hydrophilic resin 56 is a photocurable resin, the resin layer 55 is irradiated with light; thus, the hardenable hydrophilic resin 56 is hardened. The following description is given on the assumption that the hardenable hydrophilic resin 56 is an ultraviolet curable hydrophilic resin. The ultraviolet curable hydrophilic resin is a resin that cures by being irradiated with light having a wavelength in the ultraviolet region. The resin layer 55 is irradiated with ultraviolet light, and thereby the ultraviolet curable hydrophilic resin 56 is cured. Ultraviolet light may be applied using an ultraviolet light lamp, for example.

Then, in step S204, after the ultraviolet curable hydrophilic resin 56 that is the composition of the resin layer 55 is cured, the resin layer 55 is released from the master 1. At this time, when the resin layer 55 has adhered to the base material 50, the resin layer 55 is released together with the base material 50 from the master 1. Thus, the transfer copy 5 including the resin layer 55 to which the shape of the main concave-convex portion 11 of the master 1 is transferred can be produced. The main concave-convex portion 51 formed on the resin layer 55 of the transfer copy 5 has a shape to which the main concave-convex portion 11 of the master 1 is transferred. Further, the fine concave-convex portion 54 is formed on the surface of the main concave-convex portion 51, and the fine concave-convex portion 54 has a shape to which the fine concave-convex portion 14 of the master 1 is transferred.

Further, the transfer copy 5 produced in the above way may be used as a replica master to perform another transfer, and another transfer copy 5 may be created.

That is, in the method for producing the transfer copy 5 according to the present embodiment, transfer copies 5 can be easily mass-produced by performing imprint transfer using the master 1. Further, since the fine concave-convex portion 54 can be provided on the surface of the main concave-convex portion 51 of the transfer copy 5, the hydrophilicity of the surface of the main concave-convex portion 51 of the produced transfer copy 5 can be enhanced.

Further, by using a circular cylindrical master 1, imprinting based on a roll-to-roll system can be performed, and mass productivity can be enhanced more.

Thus, according to the present embodiment, transfer copies 5 can be easily mass-produced by performing imprint transfer using the master 1. Furthermore, since the fine concave-convex portion 54 can be provided on the surface of the main concave-convex portion 51 of the transfer copy 5, transfer copies 5 in which the hydrophilicity of the surface of the main concave-convex portion 51 is enhanced can be easily mass-produced. Moreover, in the present embodiment, by changing the irradiation conditions etc. of laser light used during the production of the master 1, the shape etc. of the fine concave-convex portion 14 formed on the master 1 can be easily changed. Therefore, according to the present embodiment, a desired fine concave-convex portion 14 can be formed on the master 1, and also a desired fine concave-convex portion 54 can be formed on the transfer copy 5 by performing transfer using the master 1. Furthermore, since also the shape of the fine concave-convex portion 54 of the transfer copy 5 can be changed, also the ease of flowing (flow velocity) of the fluid flowing through the main concave-convex portion 51 can be controlled by changing the shape of the fine concave-convex portion 54.

EXAMPLES

The master 1 and the transfer copy 5 according to an embodiment of the present invention will now be specifically described with reference to Examples and Comparative Example. Examples shown below are only examples of the master 1 and the transfer copy 5 according to an embodiment of the present invention, and the master 1 and the transfer copy 5 according to an embodiment of the present invention are not limited to the following examples.

<Production of Master 1>

Masters 1 according to Examples 1 to 6 and Comparative Example were produced by the following method.

Example 1

The surface of a base material 10 of SUS 420 (martensite-based stainless steel) with a thickness of 10 mm and sides of 25 mm was subjected to NiP plating treatment with a thickness of 150 μm, and thereby a surface layer 16 made of NiP was formed.

Next, on the surface of the base material 10 provided with the surface layer 16 of NiP, a plurality of concavities 13 extending in a straight line in the plane of the base material 10 were formed with a diamond bit using an ultraprecision cutting machine, and thereby a plurality of main concave-convex portions 11 were formed. Specifically, the width of the bottom surface of the concavity 13 was set to 40 μm, the depth of the concavity 13 from the surface of the base material 10 was set to 120 μm, and the pitch (period) of the main concave-convex portion 11 was set to 200 μm.

Further, the surface of the main concave-convex portion 11 was subjected to DLC coating, and thus a coating layer 15 made of DLC with a thickness of 1 μm was formed.

Subsequently, ultrashort pulse laser light was applied to the surface of the main concave-convex portion 11. For the application of laser light, an ultrashort pulse laser processing apparatus 8 of linearly polarized light with a wavelength of 780 nm, a pulse width of 200 fs, a repetition frequency of 1 kHz, and a maximum power of 1 W was used. The beam was shaped via lenses, and a Gaussian beam having a diameter of approximately 400 μm on the surface of the main concave-convex portion 11 was generated. The fluence per shot of ultrashort pulse laser light was set to 0.31 J/cm², and the angle of a wave plate on the optical path was set so that the polarization direction of laser light might be orthogonal to the longitudinal direction of the main concave-convex portion 11. Laser light was scanned at a scanning speed of 20 mm/s in the longitudinal direction of the main concave-convex portion 11 while being kept overlapping with a pitch of 80 μm, and thereby laser light was applied to the entire surface of the main concave-convex portion 11. By the above steps, a master 1 according to Example 1 was produced.

Example 2

A master was created in a similar manner to Example 1 except that the irradiation fluence of laser light was set to 0.28 J/cm².

Example 3

A master was created in a similar manner to Example 1 except that the irradiation fluence of laser light was set to 0.25 J/cm².

Example 4

A master was created in a similar manner to Example 1 except that the irradiation fluence of laser light was set to 0.22 J/cm².

Example 5

A master was created in a similar manner to Example 1 except that the irradiation fluence of laser light was set to 0.19 J/cm².

Example 6

A base material 10 was formed of SUS 304 (stainless steel), and the surface was processed using the conditions of a wavelength of 515 nm, a pulse width of 3 ps, a repetition frequency of 50 kHz, a maximum power of 7.7 W, a beam size of approximately 100 μm×100 μm (top hat beam profile), a scanning pitch of 100 μm, a scanning speed of 31 mm/s, and an irradiation fluence of laser light of 0.08 J/cm²; thus, a master 1 was created.

Comparative Example

A master was created in a similar manner to Example 1 except that ultrashort pulse laser light irradiation was not performed.

<Evaluation of Master 1>

Figure 12:
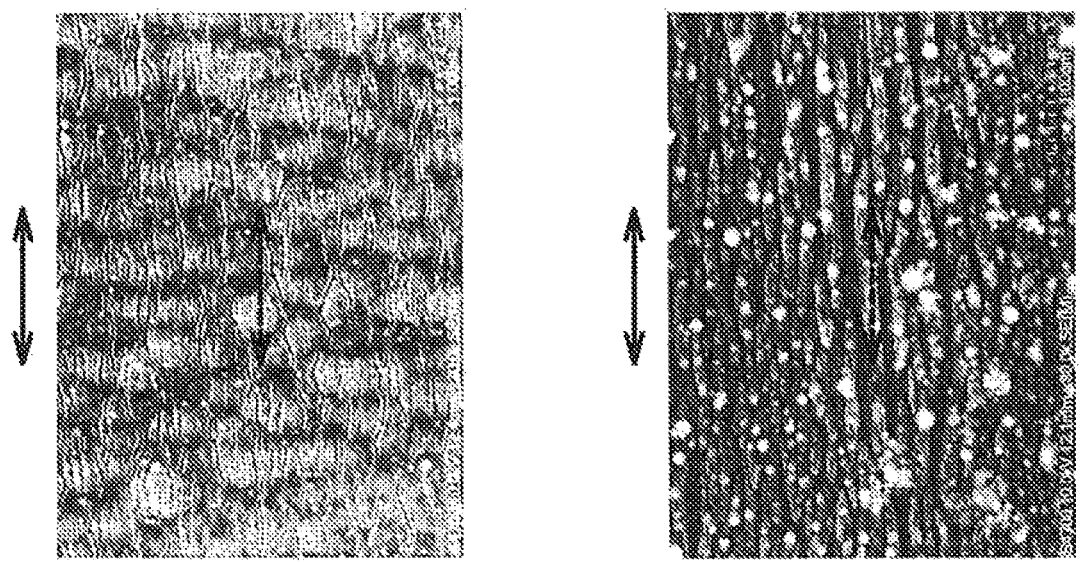
FIG. 12 is SEM images of surfaces of the main concave-convex portion 11 of the master 1 according to Example.

The masters 1 produced by the above steps were evaluated. Specifically, the fine concave-convex portion 14 of the master 1 according to Example 4 produced by the above steps was observed using a scanning electron microscope (SEM). The results of SEM observation of the master 1 according to Example 4 will now be described using FIG. 12. FIG. 12 is SEM images in which surfaces of the main concave-convex portion 1 of the master 1 according to Example 4 are observed. Specifically, FIG. 12(a) is a SEM image in which the upper surface of the convexity 12 of the master 1 is observed, and FIG. 12(b) is a SEM image in which the bottom surface of the concavity 13 of the master 1 is observed. As can be seen from these SEM images, fine concave-convex portions 14 are formed on the upper surface of the convexity 12 and the bottom surface of the concavity 13. Further, the fine concave-convex portion 14 is formed so as to extend along the longitudinal direction of the main concave-convex portion 11.

Here, a change occurs to the laser light intensity distribution due to the occurrence of the interference and diffraction of laser light caused by the shape of the main concave-convex portion 11 and due to the difference in the amount of deviation from the focus position of laser light; consequently, a difference occurs in the width of the fine concave-convex portion 14 and the depth of the fine concavity 18 between the fine concave-convex portion 14 formed on the upper surface of the convexity 12 and the fine concave-convex portion 14 formed on the bottom surface of the concavity 13. Further, also in the bottom surface of the concavity 13, the width of the fine concave-convex portion 14 and the depth of the fine concavity 18 are values different between positions.

<Creation of Transfer Copy 5>

Using the masters 1 according to Examples 1 to 6 and Comparative Example produced by the above steps, transfer copies 5 were created by the steps described below.

The master 1 is subjected to cleaning and mold release treatment. Next, an ultraviolet curable hydrophilic resin 56 made of an acrylic resin acrylate is applied to the surface provided with the main concave-convex portion 11 of the master 1, and a resin layer 55 is formed. Next, a resin base material 50 is pressed against the resin layer 55. Then, the resin layer 55 is irradiated with ultraviolet light with a center wavelength of 365 nm using an ultraviolet lamp, and the ultraviolet curable hydrophilic resin 56 is cured. Further, the resin layer 55 is released from the master 1; thus, transfer copies 5 according to Examples 1 to 6 and Comparative Example were created in this manner.

<Evaluation of Transfer Copy 5>

The fine concave-convex portion 54 formed on the bottom surface of the concavity 53 of the transfer copy 5 formed using the master 1 according to Examples 1 to 6 was observed with an AFM. The results of AFM observation of the fine concave-convex portion 54 of the transfer copy 5 according to Examples 1 to 5 will now be described using FIG. 13. FIGS. 13(a) to 13(e) are the AFM data of the fine concave-convex portion 54 formed on the bottom surface of the concavity 53 of the transfer copy 5 formed using the master 1 according to Examples 1 to 5. Further, on the basis of these AFM data, the arithmetic average roughness (Ra) and the specific surface area ratio of the bottom surface of the concavity 53 of each transfer copy 5 were calculated.

Further, the pure water contact angle on the bottom surface of the concavity 53 of the transfer copy 5 according to Examples 1 to 6 and Comparative Example was measured. The pure water contact angle can be used as an index of hydrophilicity; it can be assessed that, the smaller this value is, the higher the hydrophilicity is. The pure water contact angle is measured by, using an automatic contact angle meter CA-V (manufactured by Kyowa Interface Science Co., Ltd.), putting pure water into a syringe, attaching a stainless steel needle to the tip, and dropping 1 μL of drops onto the bottom surface of the concavity 53 under the condition of 25° C.

The arithmetic average roughness, the specific surface area ratio, and the pure water contact angle of the bottom surface of the concavity 53 of the transfer copy 5 according to Examples 1 to 6 and Comparative Example are shown in Table 1 below along with a processing condition during the creation of the master 1 (the value of the fluence of laser light irradiation) and the material of the laser light irradiation portion of the master 1.

TABLE 1

| | Master | | Transfer copy | | |
| --- | --- | --- | --- | --- | --- |
| | Material of laser light irradiation portion | Fluence of laser light irradiation during master creation (J/cm$^2$) | Arithmetic average roughness Ra (nm) | Specific surface area ratio | Hydrophilicity Pure water contact angle (deg) |
| Example 1 | DLC | 0.31 | 85.7 | 2.32 | 3.1 |
| Example 2 | DLC | 0.28 | 71.4 | 2.23 | 3.0 |
| Example 3 | DLC | 0.25 | 51.2 | 1.96 | 3.8 |
| Example 4 | DLC | 0.22 | 30.1 | 1.77 | 3.7 |
| Example 5 | DLC | 0.19 | 10.8 | 1.15 | 9.4 |
| Example 6 | SUS 304 | 0.08 | 55.8 | 1.88 | 4.0 |
| Comparative Example | DLC | No laser light irradiation | — | — | 19.2 |

Figure 13:
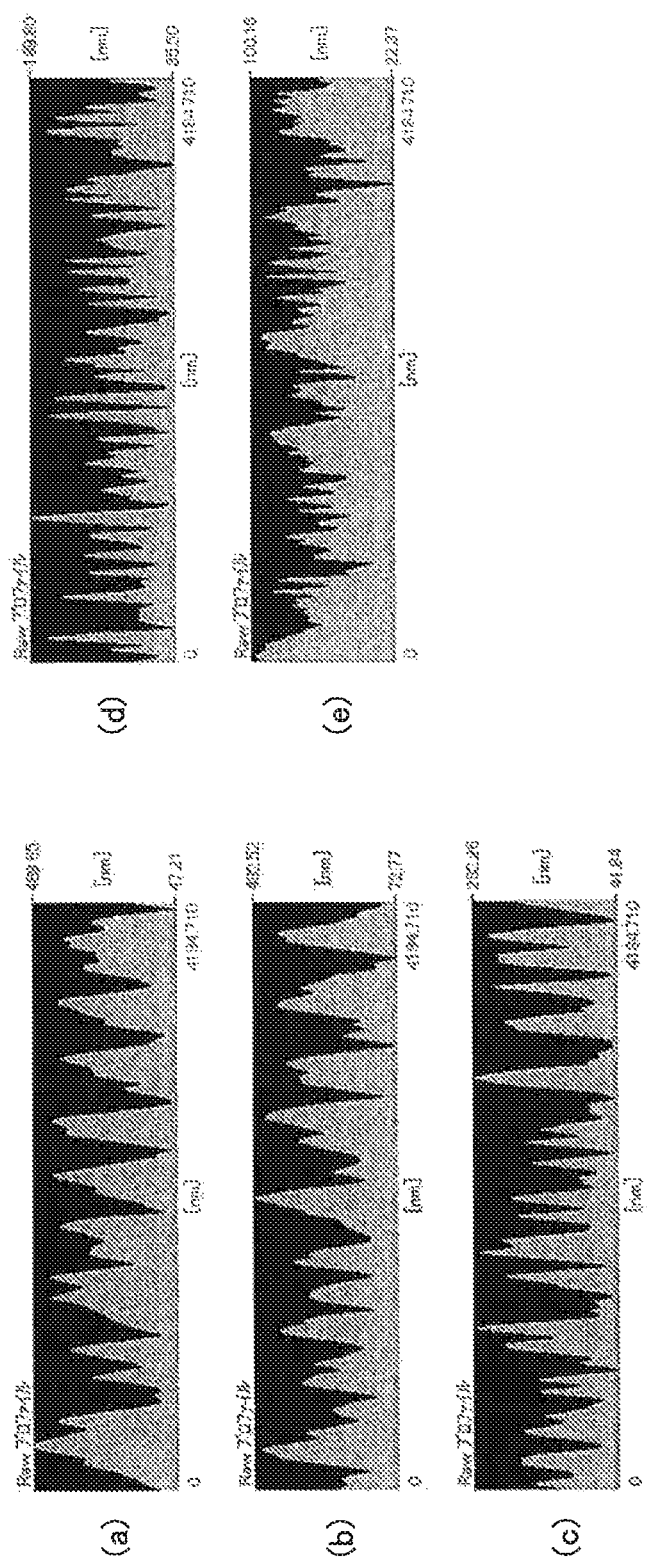
FIG. 13 is the results of AFM observation of the bottom surface of a concavity 53 of the transfer copy 5 according to Examples.

As can be seen from the AFM data of FIG. 13, a fine concave-convex structure, that is, fine concave-convex portions 54 are formed on the bottom surface of the concavity 53 of the transfer copy 5 according to Examples 1 to 5. This is due to the fact that the shape of the fine concave-convex portion 14 formed on the surface of the convexity 12 of the master 1 has been transferred to the transfer copy 5.

On the bottom surface of the concavity 53 of the transfer copy 5 according to Examples 1 to 6, the flow velocity of liquid is increased and the hydrophilicity is improved as compared to Comparative Example. Further, also from the fact that the pure water contact angles of Examples 1 to 6 are smaller than that of Comparative Example, it can be seen that the bottom surface of the concavity 53 of the transfer copy 5 according to Examples 1 to 6 has improved hydrophilicity. This is presumed to be because the fine concave-convex portion 54 has been provided on the bottom surface of the concavity 53 of the transfer copy 5.

From the results of Table 1, it has been found that the hydrophilicity is improved when the fine concave-convex portion 54 is formed on the bottom surface of the concavity 53 of the transfer copy 5 and the bottom surface of the concavity 53 of the transfer copy 5 has an arithmetic average roughness of 10 nm to 150 nm and a specific surface area ratio of 1.1 to 3.0, as compared to the transfer copy 5 according to Comparative Example in which the fine concave-convex portion 54 is not present.

It has been found that, in the case of Example 6 in which the material of the laser light irradiation portion is SUS 304 (stainless steel), a fine concave-convex portion 54 of a transfer copy 5 having an arithmetic average roughness Ra and a specific surface area ratio substantially equal to those in the case of Examples 1 to 5 in which the material of the laser light irradiation portion of the master 1 is DLC has been formed even when the fluence per shot of laser light is 0.08 J/cm$^2$, and the hydrophilicity has been improved. From this, it can be seen that the preferred range of fluence varies with the material of the laser light irradiation portion. Similar results to SUS 304 have been obtained also when the material is Cu or Ni.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

REFERENCE SIGNS LIST 1 master
5 transfer copy
8 laser processing apparatus
10, 50 base material
11, 51 main concave-convex portion
12, 52 convexity
13, 53 concavity
14, 54 fine concave-convex portion
17, 57 fine convexity
18, 58 fine concavity
15 coating layer
16 surface layer
340 laser main body
341 wave plate (e.g., λ/2 wave plate)
343 cylindrical lens
344 linear stage
55 resin layer
56 hardenable hydrophilic resin

The invention claimed is:

1. A master for micro flow path creation comprising:
a base material;
a surface layer comprising a main concave-convex portion, the surface layer provided on a surface of the base material and extending in a planar direction of the base material; and
a coating layer comprising a fine concave-convex portion, the coating layer provided on a surface of the main concave-convex portion, and the fine concave-convex portion having a narrower pitch than the main concave-convex portion,
wherein the fine concave-convex portion has an arithmetic average roughness of 10 nm to 150 nm and has a specific surface area ratio of 1.1 to 3.0.

2. The master for micro flow path creation according to claim 1,
wherein the main concave-convex portion has a width and a depth of 1 μm to 2000 μm, and
the fine concave-convex portion has a width and a depth of 30 nm to 1000 nm.

3. The master for micro flow path creation according to claim 2, comprising a plurality of the fine concave-convex portions,
wherein the widths and the depths of the fine concave-convex portions are values different between positions where the fine concave-convex portion is formed.

4. The master for micro flow path creation according to claim 1, wherein the fine concave-convex portion is provided so as to extend along a longitudinal direction of the main concave-convex portion.

5. A method for producing the master for micro flow path creation according to claim 1, comprising:
forming, on a surface of a base material, a main concave-convex portion extending in a planar direction of the base material; and
forming, on a surface of the main concave-convex portion, a fine concave-convex portion having a narrower pitch than the main concave-convex portion, by irradiating the surface of the main concave-convex portion with ultrashort pulse laser light having a pulse width of 10 picoseconds or less.

6. The method for producing a master for micro flow path creation according to claim 5, wherein the ultrashort pulse laser light is applied such that a polarization direction is orthogonal to a longitudinal direction of the main concave-convex portion.

7. A transfer copy comprising a resin layer to which a surface shape of the master for micro flow path creation according to claim 1 is transferred.

8. A transfer copy comprising:
a resin layer;
a main concave-convex portion provided on a surface of the resin layer and extending in a planar direction of the resin layer; and
a fine concave-convex portion provided on a surface of the main concave-convex portion and having a narrower pitch than the main concave-convex portion,
wherein the fine concave-convex portion is present only on the bottom surface of the concavity and/or the upper surface of the convexity of the main concave-convex portion, and
wherein the fine concave-convex portion has an arithmetic average roughness of 10 nm to 150 nm and has a specific surface area ratio of 1.1 to 3.0.

9. The transfer copy according to claim 8,
wherein the main concave-convex portion has a width and a depth of 1 μm to 2000 μm, and
the fine concave-convex portion has a width and a depth of 30 nm to 1000 nm.

10. The transfer copy according to claim 9, comprising a plurality of the fine concave-convex portion,
wherein the widths and the depths of the plurality of the fine concave-convex portion are values different between positions where the fine concave-convex portion is formed.

11. The transfer copy according to claim 8, wherein the fine concave-convex portion is provided so as to extend along a longitudinal direction of the main concave-convex portion.

12. The transfer copy according to claim 7, wherein the resin layer is made of a hardenable hydrophilic resin.

13. A micro fluid chip comprising the transfer copy according to claim 8.

14. The master for micro flow path creation according to claim 1,
wherein the fine concave-convex portion is present only on the bottom surface of the concavity and/or the upper surface of the convexity of the main concave-convex portion.

15. The master for micro flow path creation according to claim 1,
wherein the fine concave-convex portion is present only on the bottom surface of the concavity of the main concave-convex portion.

16. The master for micro flow path creation according to claim 1,
wherein the fine concave-convex portion is present only on the upper surface of the convexity of the main concave-convex portion.

17. The master for micro flow path creation according to claim 1,
wherein the surface layer and the coating layer comprise different materials.

18. The master for micro flow path creation according to claim 1,
wherein the surface layer comprises NiP, and the coating layer comprises DLC coating.

* * * * *